US006977223B2

(12) United States Patent  (10) Patent No.: US 6,977,223 B2
George et al.  (45) Date of Patent: Dec. 20, 2005

(54) THREE DIMENSIONAL MICROFABRICATION

(75) Inventors: Paul M. George, Boston, MA (US); Robert S. Langer, Newton, MA (US); David A. Lavan, Hamden, CT (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 10/794,610

(22) Filed: Mar. 5, 2004

(65) Prior Publication Data

US 2004/0222102 A1  Nov. 11, 2004

Related U.S. Application Data

(60) Provisional application No. 60/452,891, filed on Mar. 7, 2003.

(51) Int. Cl.[7] .............................................. H01L 21/44
(52) U.S. Cl. ...................................... 438/676; 438/764
(58) Field of Search ................................ 438/676, 764, 438/687, 677, 610

(56) References Cited

U.S. PATENT DOCUMENTS 4,936,956 A * 6/1990 Wrighton ................. 205/777.5

FOREIGN PATENT DOCUMENTS

GB          2237291 A * 5/1991

* cited by examiner

*Primary Examiner*—Caridad Everhart
(74) *Attorney, Agent, or Firm*—Choate, Hall & Stewart LLP

(57) ABSTRACT

Method for making three-dimensional structures. A template is provided having at least two conductive regions separated by a non-conductive region. The template is disposed in an electrolyte in an electrodeposition cell and a voltage is established between one of the conductive regions and an electrode in the cell. Material is deposited on the one of the conductive regions connected to the voltage and subsequently bridges to the other conductive region with material deposition continuing on both of the at least two regions. The non conductive region may be a gap and the gap dimension is selected to regulate height differences between the at least two conductive regions.

14 Claims, 2 Drawing Sheets

200μm

THREE DIMENSIONAL MICROFABRICATION

This application claims priority to provisional application Ser. No. 60/452,891 filed Mar. 7, 2003 entitled "Methods and Uses for Simple Three-Dimensional Microfabrication," the contents of which are incorporated herein by reference.

BACKGROUND OF THE INVENTION

This invention relates to the three-dimensional microfabrication of structures and more particularly to the microfabrication of electrodeposited structures.

Making three-dimensional (3-D) micromachined objects is difficult using current techniques; there are few alternatives to using a large number process steps and photolithographic masks. An example is the formation of poly (dimethyl siloxane) (PDMS) replicas of micromachined master patterns for soft lithography and for the creation of microfluidic devices. See, A. Kumar, N. L. Abbott, H. A. Biebuyck, E. Kim, G. M. Whitesides, *Acc. Chem Res.* 1995, 28, 219; E. Kim, Y. Xia, G. M. Whitesides, *J. Am. Chem. Soc.* 1996, 118, 5722; and D. C. Duffy, J. C. McDonald, O. J. A. Schueller, G. M. Whitesides, *Anal. Chem.* 1998, 70, 4974. The fabrication of these microfluidic devices relies on bulk micromachining of silicon wafers or a thick layer of patterned photoresist to generate a master pattern—the reversed sense of the pattern is generated by casting a soft replica over this master. There is much interest in producing 3D structures using surface or bulk micromachining techniques for the creation of more complex masters for microfluidic devices, as well as for other uses. See, B. -H. Jo, D. J. Beebe, *Proc. SPIE—Int. Soc. Opt. Eng.* 1999, 3877, 222; O. Hoffman, G. Voirin, P. Niedermann, A. Manz, *Anal. Chem.* 2002, 74, 5243; and L. Griscom, P. Degenaar, B. LePioufle, E. Tamiya, H. Fujita, *Jpn. J. Appl. Phys. Part* 1 2001, 40, 5485. Much of the published work that describes 3D microfluidic devices relies on the layer-by-layer construction of the structures that requires a large number of masks and process steps and the awkward alignment and assembly of the individual layers. The master pattern shown in FIG. 1 demonstrates how easily a 3D microfluidic master can be formed, in this case, a gold film patterned onto a silicon nitride covered wafer. The technique can create devices with a large ratio between the thickest and thinnest structures (a ratio of 50:1 has been fabricated).

Pyrrole films have been extensively electrodeposited for more than 20 years and various dopants have been used. A. F. Diaz, K. K. Kanazawa, G. P. Gardini, *J. Chem. Soc. Chem. Commun.* 1979, 635; G. Sabouraud, S. Sadki, N. Brodie, *Chem Soc. Rev.* 2000, 29, 283. Of special interest for this technique are dopants that are highly chemically resistant since microfabrication often involves aggressive cleaning and etching steps. Although the exact mechanism for electrodeposition of polypyrrole (PPy) is not fully understood, it involves the oxidation of the pyrrole monomer followed by several chemical and electron-transfer reactions. G. Sabouraud, S. Sadki, N. Brodie, *Chem Soc. Rev.* 2000, 29, 283. Pyrrole electropolymerization propagates with a 3D nucleation/growth pattern under charge transfer control. Films grow with different time constants in the upward and lateral directions. M. E. G. Lyons, *Adv. Chem. Phys.* 1996, 94, 297. The time constants vary as a function of current density, temperature, dopants, etc.

It is also known to use electroforming and molding to prepare planar microdevices with critical features of tens to thousands of micrometers. Such a technique uses metal electroplated into an x-ray defined poly(methyl methacrylate) (PMMA) mold. This prior art technique is known as LIGA from its German language acronym for making microelectromechanical systems (MEMS). E. W. Becker, W. Ehrfeld, P. Hagmann, A. Maner, D. Muenchmeyer, *Microelectron. Eng.* 1986, 4, 35. Many LIGA MEMS are produced from nickel.

An object of the invention therefore is a simpler technique for microfabrication of structures using very few steps and a single photolithographic mask.

SUMMARY OF THE INVENTION

In one aspect, the method for making three dimensional structures according to the invention includes providing a template having at least two conductive regions separated by a non-conductive region. The template is disposed in an electrolyte in an electrodeposition cell and a voltage is established between one of the conductive regions and an electrode in the cell. Material is deposited on the one of the conductive regions conducted to the voltage and subsequently bridges to the other conductive region so that material deposition continues on both of the at least two regions. In a preferred embodiment the non-conductive region is a gap between the regions and the gap dimension is selected to regulate height differences between the at least two conductive regions. The template need not have gaps but merely have regions that behave effectively as gaps—for example, a conductive template modified to be non-conductive in a small region. The deposited material may be a polymer such as polypyrrole or a metal such as nickel. Suitable gap dimensions are in the range of 0.5 to 500 $\mu$m.

More generally, the deposited material may be selected from the group consisting of metals, semiconductors, polymers, ceramics, drugs, biomolecules, mixtures of polymers for extended release of drugs and biomolecules, conductive polymers and conductive polymers with dopants. Conductive polymers include those formed from pyrrole and the range of dopants (NaDBS, PSS, others) include those that can be used to control the chemical properties of the conductive polymers such as solubility. The structures created by the method of the invention may have vertical or non-vertical sidewalls. The structures may include alternating sacrificial and structural regions. Sacrificial regions may be removed by dissolution or thermal decomposition and the structural regions may be soluble or susceptible to thermal decomposition.

The structures made according to the method of the invention may be used in a multi-step fabrication process and may be used as a master pattern to shape, form, cast or emboss microfluidic channels. The structures made according to the invention can be used to produce optical devices such as storage devices, masters for storage media, lenses, splitters, gratings, switches and reflectors. These optical devices may be produced on a rigid or flexible substrate. A suitable flexible substrate include membranes, cantilever beams or fluids.

The structures made according to the invention can also be used to make mechanical devices including nozzles, valves, pumps, reservoirs, resonators, actuators, bearings, gears, beams and switches.

The structures made according to the invention can also be used to produce channels on or within a polymer scaffold for tissue engineering purposes. Such channels can be utilized as a conduit for fluid flow, as a template for cell growth or vascularization or to guide nerve growth.

Yet another use of the structures made according to the method of the invention is to enable measurement of cells and tissue such as impendance measurements, patch clamp measurements, EEG and EKG. The structures made according to the invention may also be used to enable interfacing with cells and tissue. Interfacing includes with nerve, neural, muscle, or cardiac tissue, or stimulation, pacemaker leads and sensors, biosensors, guided nerve regeneration devices and pain management devices. The structures made according to the invention may also be used for in-vivo and in-vitro delivery or release of chemicals, drugs, nucleic acids and amino acids. Nucleic acids include modified, conjugated, synthetic and natural forms of DNA, RNA and PNA, including aptamers, RNAi, single-strand DNA, single-strand PNA, DNA aptamers, PNA aptamers, and RNA aptamers. Amino acids include modified, conjugated, synthetic and natural forms of peptides and proteins, including binding proteins, antibodies, antigens, enzymes, and peptides.

The structures made according to the invention may also be used as a master pattern to emboss foils or thin films. The embossed foils or films may be used as security devices, for decorative purposes or for data storage.

The structures made according to the invention may be used to attach circuits that are isolated or separated by a gap. The circuits may be self-assembled by fluidic self-assembly or assembled from a discrete die that is separated by a gap or space.

As used herein template means any pattern, whether formed by micro- or nano-fabrication, including maskless lithography, photolithography, e-beam lithography, soft lithography, stamping (printing), ink-jet printing, laser printing or self-assembly. By deposition is meant any method of depositing material from liquid or gas, including liquid phase deposition techniques such as living front polymerization, self-assembly, electroplating, electropolymerization, or electro-oxidation, as well as vapor deposition techniques.

DESCRIPTION OF THE PREFERRED EMBODIMENT

The present invention is a new approach to generate 3D microfabricated structures using very few steps and a single photolithographic mask. The approach relies on a conductive template that can be produced using conventional lift-off microfabrication, or by other means such as self-assembly or printing followed by an electrodeposition step to produce the full structure. The design of the conductive template determines the full 3D structure. Gaps, or non-conductive areas, between conductive regions of the template are intentionally introduced. As material is deposited it expands both vertically and horizontally; the horizontal expansion bridges the spaces between the conductive regions. Once that space is bridged the electrodeposited material forms an electrical connection with the new region and deposition then continues not only on the existing structure but on the newly connected region as well.

Figure 2A:
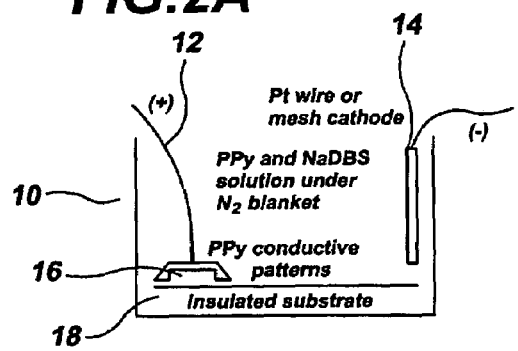
FIGS. 2A, B, C, and D are schematic illustrations of an electrodeposition cell for practicing an embodiment of the present invention.
Figure 2B:
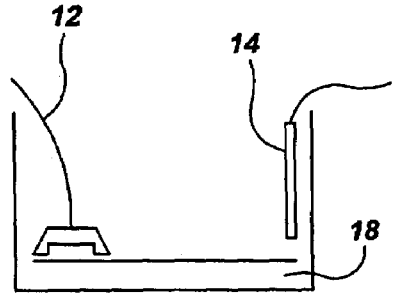
Figure 2C:
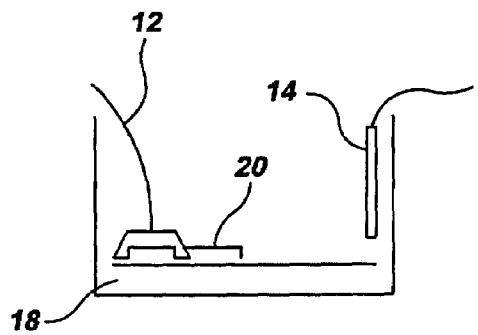
Figure 2D:
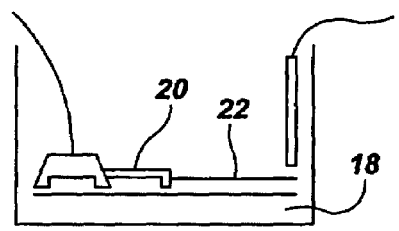

FIGS. 2a, b, c, and d are schematic illustrations of an embodiment of apparatus for carrying out the process of the invention. With reference to FIG. 2a, an electrodeposition cell 10 contains polypyrrole (PPy) and a sodium salt of dodecylbenzenesulfonic acid (NaDBS) solution under an $N_2$ blanket. A wire 12 is connected to a positive voltage source and a platinum wire or mesh cathode 14 is connected to a negative voltage source. The anode wire 12 is connected to an isolated conductive pattern 16 on an insulated substrate 18. Polypyrrole deposits on the conductive pattern 16. The deposited PPy film grows horizontally and vertically from the initial region as shown in FIG. 2b. The deposited PPy film then bridges to a new region 20 as shown in FIG. 2c with the deposition continuing over the larger surface. As shown in FIG. 2d, the deposited film bridges to yet another region 22. Importantly, the relative heights of each region are determined by the spaces or gaps between the regions. This is the case because deposition in a subsequent region begins only when it becomes electrically connected to the previous region by the bridging deposition.

In the example shown in FIGS. 2a, b, c, d, NaDBS was chosen as the dopant so that the resulting deposited structure is highly chemical resistant. See, L. F. Warren, D. P. Anderson, *J. Electrochem. Soc.* 1987, 134, 101. Other dopants can create polymers that erode in water which may be of use for creating water soluble sacrificial structures. A. N. Zelikin, D. M. Lynn, J. Farhadi, I. Martin, V. Shastri, R. Lander, *Angew. Chem.* 2002, 114, 149; *Angew. Chem. Int. Ed.* 2002, 41,141.

Figure 1:
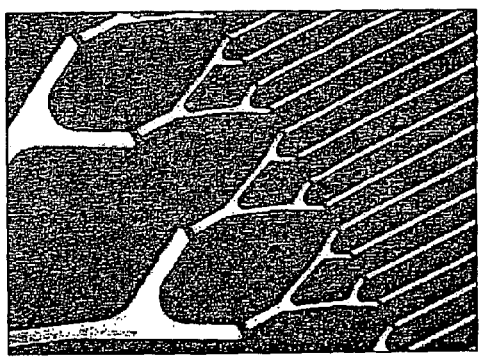
FIG. 1 is a photomicrograph of a 3D master pattern to cast a microfluidic mimic of a vascular network.

After studying the characteristics of a variety of PPy films, and observing the well-defined and adherent borders on the films, we surmise that it would be possible to form stepped 3D structures by intentionally leaving spaces in the electrode pattern. Experiments have been performed to establish that the film, as it grows, will bridge across the patterns and reliably make an electrical connection to each subsequent unattached region in the pattern. A series of test structures have been produced, including some intended as a microfluidic mimic of a vascular network (FIG. 1). Our experiments have demonstrated that the lateral growth of a film will indeed bridge from the original anode to unattached conductive regions on the surface, and once a gap is bridged, the polymerization process will continue over the entire area.

Figure 3:
FIG. 3 is a scanning electron microscope image of a 3D structure made according to an embodiment of the invention.

FIG. 3 is the PPy structure resulting from the method of the invention applied to the 3D master pattern of FIG. 1. In FIG. 3 the smallest lines are 10 μm high and the tallest are 80 μm. The deposition process originated from the left side of the image.

Figure 4:
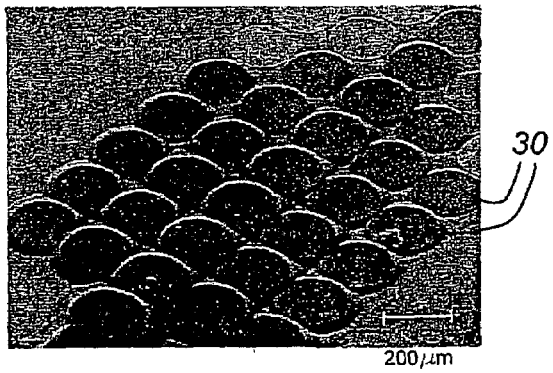
FIG. 4 is a photomicrograph of a polypyrrole pattern made according to an embodiment of the invention.

With reference now to FIG. 4 a test pattern in the form of an array of unattached circles 30 was provided. The original circles 30 were 200 μm in diameter and 10 μm apart. The circle 30 in the lower left corner of the image was attached to an anode and deposition originated from that circle. A PPy pattern was grown at 3 mA cm$^{-2}$ for 48 minutes. Note that the middle column of circles has bridged eight gaps. Similarly, in FIG. 5 a nickel structure was electroplated at 3 mA cm$^{-2}$ for 14 hours. Note that the middle column has bridged six gaps. The result with nickel deposition was similar to those with PPy except for significantly slower deposition rates and a radial expansion of the front, rather than a distinctly faceted surface. Also, the surface roughness of the nickel is significantly greater than that of PPy. Nickel LIGA wafers are routinely lapped to remove this roughness but this option is not available for multilevel structures.

Figure 5:
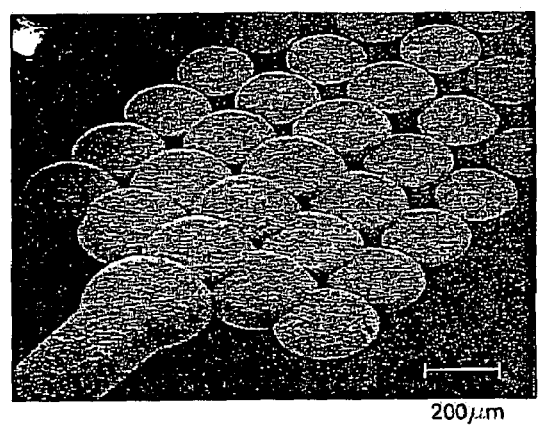
FIG. 5 is a photomicrograph of a nickel structure made according to an embodiment of the invention.

Comparing the two materials, there is a noticeable difference in the growth rates and growth behavior of PPy and nickel. The rate of electropolymerization for PPy is 780 nm min$^{-1}$ vertically and 1000 nm min$^{-1}$ horizontally, under the conditions to be described below. Nickel had a deposition rate of 105 nm min$^{-1}$, both vertically and horizontally. The 4:3 lateral-to-vertical growth rate for PPy creates a well-defined faceted profile with the polymer growing slightly faster outward then upward. See FIG. 4. The nickel grows uniformly in all directions which results in the edges of the pattern having a radius equal to the film thickness as shown in FIG. 5. Depending on the application, one or the other of the materials may be more desirable. The PPy surface appears smoother than the nickel surface and it deposits more rapidly. The side walls of the nickel structures, however, are closer to vertical than the corresponding PPy patterns. Vertical sidewalls, or a limit on horizontal expansion, could be obtained by introducing a sacrificial boundary such as one made from photoresist around the conductive patterns.

Figure 6:
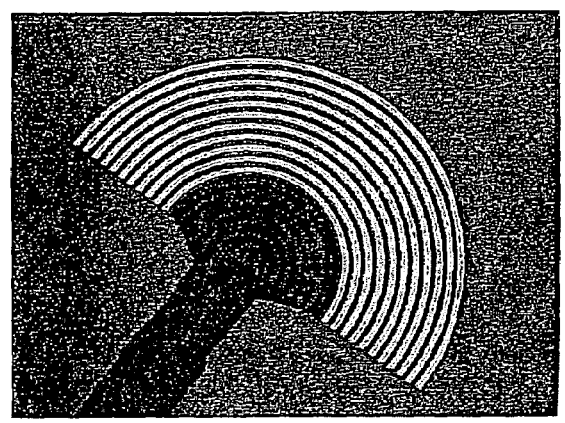
FIG. 6 is a photomicrograph of a convex structure formed by initiating deposition at the center of a concentric pattern.
Figure 7:
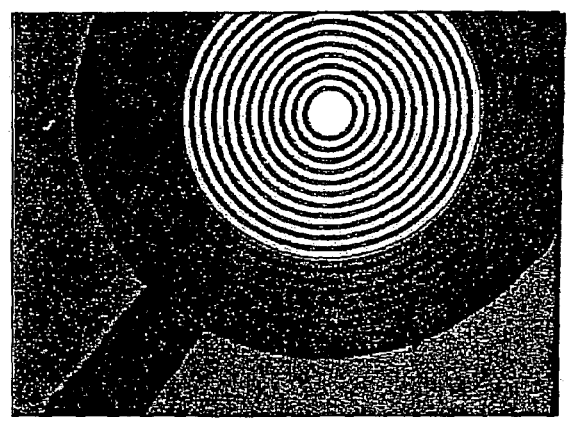
FIG. 7 is a photomicrograph of a convex structure formed by initiating deposition at the outer edge of a concentric pattern.
Figure 8:
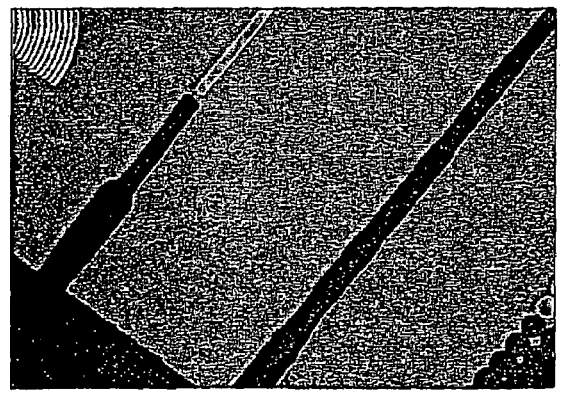
FIG. 8 is a photomicrograph of lines of varying taper produced by adjusting the gap between otherwise equally sized patterns.

The approach disclosed herein has been demonstrated with a variety of test structures—we have been able to form tapered lines, branched structures, and concave and convex features. Very tall features such as mechanical barriers or sealing rings around a critical region of a device can also be produced. As shown in FIGS. 6 and 7, concave and convex devices were created by a series of concentric patterns. The curvature is a function of the spacing of the pattern and whether the deposition initiates from the inner or outer edge. It was observed in a series of finely spaced lines or arcs provides a more uniform deposition front than those with greater separation; each time the deposited material bridges from one conductive pattern to the next the expanding front is smoothed. By varying the width of a line pattern, a 3D structure can be produced that varies in thickness and width, or the pattern can be designed so that the final structure maintains a constant width while varying only in thickness. See FIG. 8.

EXPERIMENTAL METHODS

The layouts were generated with AutoCAD software, and DXF files were converted to a chrome-on-glass mask (International Phototool Company). The plating template was formed on 4-inch (10-cm) silicon wafers with a 3000-Å insulating layer of silicon nitride grown by low-pressure chemical vapor deposition (LPCVD). A standard lift-off process was used to pattern the gold electrodes: photoresist was patterned onto the wafer, 200 Å of titanium was deposited as an adhesion layer, after which 3000 Å of gold was deposited to form the conductive pattern. The photoresist was removed, which left behind the gold only in regions deposited directly onto the wafer. The wafers were cut into dies using a flood-cooled die saw. The patterns were protected using an additional layer of photoresist during die sawing; after sawing, the individual dies were cleaned in acetone, ethanol, and deionized water before use-it should be noted that greater adhesion could be achieved using more advanced cleaning procedures, or the addition of a titanium adhesion layer over the conductive layer.

The electrodeposition of PPy occurred at 25° C. using a constant-current power supply (HP 6614C). The current density was 3 mA cm$^{-2}$. The temperature and current density were varied to find the conditions that gave the smoothest deposited films. Other conditions can produce particularly rough surfaces. Solutions of 0.2M pyrrole with 0.2M NaDBS (both Aldrich) as a dopant were prepared more than 24 h in advance to ensure complete dissolution of the constituents. They were stored at 4° C. under nitrogen. Achieving uniform deposition over a large area was difficult, therefore a platinum wire-mesh cathode was used with an area equal to that of the pattered area of the die, and stirring was adjusted so that the flow across the surface appeared uniform; deposition occurred under a nitrogen blanket. After deposition, the devices were ultrasonically cleaned in deionized water to remove loosely adherent deposits.

The nickel was electroplated using standard procedures. See, T. E. Buchheit, D. A. LaVan, J. R. Michael, T. R. Christenson, S. D. Leith, *Metall. Mater. Trans. A* 2002, 33, 539; and W. H. Safranek, *The Properties of Electrodeposited Metals and Alloys:* a Handbook, 2$^{nd}$ ed., American Electroplaters and Surface Finishers Society, Orlando, Fla. 1986. The gold pattern acted as the cathode along with a pure nickel anode, and the plating bath was a commercially available nickel sulfamate solution (Mechanical Nickel Sulfamate, Technic Inc.). Current density was regulated to 3 mA cm$^{-2}$. These dies were also ultrasonically cleaned in deionized water after deposition.

The technique disclosed herein is a new method to fabricate multi-level structures such as electrodes, interconnects, gratings and photonic lattices. These structures can be augmented with additional films patterned over an initial layer. The present invention can be used to bridge gaps to form low-impedance connections between devices and substrates produced by self-assembly or fluidic self-assembly. H. -J. J. Yeh, J. S. Smith, *Sens. Mater.* 1994, 6, 319; J. S. Smith, Alien Technology Corporation, U.S. Pat. No. 6,291, 896 2001. The method of the invention can also be used to modify the LIGA process wherein regions of a microdevice are deposited to regulate the effect of current densities or to create composite or gradient materials from a single mold or pattern. Many other uses for the structures made by the method of the invention have been set forth in the Summary of the Invention section of this specification.

The teachings of all of the references cited herein are incorporated by reference in their entirety.

It is recognized that modifications and variations of the invention set forth herein will occur to those skilled in the art and it is intended that all such modifications and variations be included within the scope of the appended claims.

What is claimed is:

1. Method for making three-dimensional structures comprising:
   providing a template having at least two conductive regions separated by a non-conductive region;
   disposing the template in an electrolyte in an electrodeposition cell; and
   establishing a voltage between only one of the conductive regions and an electrode in the cell, whereby material is deposited on the one of the conductive regions connected to the voltage and subsequently bridges to the other conductive regions with material deposition continuing on both of the at least two regions.

2. The method of claim 1 wherein the non-conductive region is a gap.

3. The method of claim 2 wherein the gap dimension is selected to regulate height differences between the at least two conductive regions.

4. The method of claim 2 wherein the gap dimension is in the range of 0.5–500 $\mu$m.

5. The method of claim 1 wherein the deposited material is a polymer.

6. The method of claim 5 wherein the polymer is polypyrrole.

7. The method of claim 1 wherein the deposited material is a metal.

8. The method of claim 7 wherein the metal is nickel.

9. The method of claim 1 wherein the deposited material is selected from the group consisting of metals, semiconductors, polymers, ceramics, drugs, biomolecules, mixtures of polymers for release of drugs and biomolecules, conductive polymers and conductive polymers with dopants.

10. The method of claim 1 wherein the 3D structures have substantially vertical side walls.

11. The method of claim 1 where in the 3D structures have non-vertical side walls.

12. The method of claim 1 wherein the 3D structures include alternating sacrificial and structural regions.

13. The method of claim 12 wherein sacrificial regions can be removed by dissolution or thermal decomposition.

14. The method of claim 12 wherein structural regions are soluble or susceptible to thermal decomposition.

* * * * *